United States Patent [19]
Melzner

[11] Patent Number: 5,864,155
[45] Date of Patent: *Jan. 26, 1999

[54] SEMICONDUCTOR ARRAY WITH SELF-ADJUSTED CONTACTS

[75] Inventor: Hanno Melzner, Unterhaching, Germany

[73] Assignee: Siemens Aktiengesellschaft, Muenchen, Germany

[*] Notice: This patent issued on a continued prosecution application filed under 37 CFR 1.53(d), and is subject to the twenty year patent term provisions of 35 U.S.C. 154(a)(2).

[21] Appl. No.: 651,305

[22] Filed: May 23, 1996

[30] Foreign Application Priority Data

May 23, 1995 [EP] European Pat. Off. ............ 951079110

[51] Int. Cl.$^6$ .......................... H01L 27/108; H01L 29/76
[52] U.S. Cl. .......................... 257/306; 257/302; 257/382; 257/401; 257/903
[58] Field of Search .................................. 257/302, 306, 257/401, 382, 903

[56] References Cited

U.S. PATENT DOCUMENTS

| | | | |
|---|---|---|---|
| 4,729,969 | 3/1988 | Suda et al. | 437/200 |
| 4,877,755 | 10/1989 | Rodder | 437/200 |
| 5,406,103 | 4/1995 | Ogawa | 257/306 |
| 5,463,236 | 10/1995 | Sakao | 257/306 |
| 5,486,712 | 1/1996 | Arima | 257/306 |
| 5,530,276 | 6/1996 | Iwasa | 257/324 |
| 5,561,311 | 10/1996 | Hamamoto et al. | 257/306 |

FOREIGN PATENT DOCUMENTS

| | | |
|---|---|---|
| 0 190 928 | 8/1986 | European Pat. Off. . |
| 0 435 392 | 7/1991 | European Pat. Off. . |
| 0 567 815 A2 | 11/1993 | European Pat. Off. . |
| 2 243 951 | 11/1991 | United Kingdom . |

OTHER PUBLICATIONS

Motorola Technical Developments Publ. Vol. 12, April 1991 (See et al.) "An Alignment–Tolerant Contact Process Using Landing Pads".

*Primary Examiner*—Valencia Martin-Wallace
*Attorney, Agent, or Firm*—Herbert L. Lerner; Laurence A. Greenberg

[57] ABSTRACT

A semiconductor array with self-adjusted contacts includes a substrate having a surface, at least two mutually spaced-apart doped regions extending in a first lateral direction on the surface, and insulated regions each being associated with a respective one of the doped regions and extending in the first lateral direction on the same side. Contact surfaces each extend in the first lateral direction above a respective one of the doped regions and at least partially above the insulated region associated with the one doped region. An insulating layer has contact holes each being formed therein above a respective one of the contact surfaces for receiving a self-adjusted contact. A method for producing a semiconductor array with self-adjusted contacts includes producing one of the contact surfaces with a first fragment being a part of the contact surface extending above the doped region and a second fragment being a part of the contact surface extending above the insulated region. The first fragment is produced with a non-photolithographic process avoiding edge location errors. The second fragment extends above the first fragment and therefore above the doped region by at least a length of a maximum edge location error, as long as no edge location errors occur.

9 Claims, 2 Drawing Sheets

SEMICONDUCTOR ARRAY WITH SELF-ADJUSTED CONTACTS

BACKGROUND OF THE INVENTION

Field of the Invention

The invention relates to a semiconductor array with self-adjusted contacts and a method for its production.

A semiconductor array with self-adjusted contacts is known from U.S. Pat. No. 4,729,969. The semiconductor array shown therein is distinguished by an electrode or contact surface that extends not only above a doped region to be contacted but also above an insulated region adjoining the doped region. The contact hole is offset from the doped regions above the insulated region. The result attained is that when there are two doped regions to be contacted, which are adjacent one another in a first lateral direction and one of which has a contact surface of the type described and another has a contact surface of the usual type that is merely disposed above the doped region, the doped regions can be positioned as close together as possible yet without failing to observe a minimum spacing between the respective contacts. One of the two contacts is then in fact disposed offset from the corresponding doped region in the direction remote from the other contact, above the corresponding insulated region.

The method described therein has the disadvantage of not attaining the desired success when there are more than two doped regions adjacent one another in a first lateral direction that are to be contacted, namely that a plurality of adjacent doped regions be spaced as close as possible to one another. If in fact the minimum spacing between two corresponding contacts is not to be undershot, then all that can be done in the way described is to decrease the spacing of the two corresponding doped regions. Conversely, their spacing from other doped regions adjacent them must even be increased, on the condition that the dimensions of the doped regions in the first lateral direction are not increased, and the same minimum spacings are adhered to between all of the contacts. The proposed structure of the contact surfaces thus does not make it possible, given an allowable minimum spacing between the doped regions, to place the doped regions and insulated regions in a regular structure.

That problem becomes even worse if, as proposed in U.S. Pat. No. 4,729,969, both contacts of two adjacent doped regions are each offset in opposite directions from the doped regions. Admittedly that does make it possible for two affected doped regions to be brought closer together, with the same minimum spacing between the contacts. Nevertheless, that can be done only at the expense of the spacing of those doped regions from other doped regions adjacent them.

SUMMARY OF THE INVENTION

It is accordingly an object of the invention to provide a semiconductor array with self-adjusted contacts and a method for its production, which overcome the hereinafore-mentioned disadvantages of the heretofore-known devices and methods of this general type and in which many doped regions to be contacted are disposed regularly in a first lateral direction with the closest possible spacing.

With the foregoing and other objects in view there is provided, in accordance with the invention, a semiconductor array with self-adjusted contacts, comprising a substrate having a surface, at least two mutually spaced-apart doped regions extending in a first lateral direction on the surface, and insulated regions each being associated with a respective one of the doped regions and extending in the first lateral direction on the same side; contact surfaces each extending in the first lateral direction above a respective one of the doped regions and at least partially above the insulated region associated with the one doped region; and an insulating layer having contact holes each being formed therein above a respective one of the contact surfaces for receiving a self-adjusted contact.

With the objects of the invention view there is also provided a method for producing a semiconductor array with self-adjusted contacts, which comprises aligning at least two mutually spaced-apart doped regions in a first lateral direction on a surface of a substrate; aligning insulated regions each being associated with a respective one of the doped regions in the first lateral direction on the same side; aligning contact surfaces in the first lateral direction above a respective one of the doped regions and at least partially above the insulated region associated with the one doped region; forming contact holes in an insulating layer above the contact surfaces for receiving a self-adjusted contact; producing one of the contact surfaces with a first fragment being a part of the contact surface extending above the doped region and a second fragment being a part of the contact surface extending above the insulated region; producing the first fragment with a non-photolithographic process avoiding edge location errors; and producing the second fragment to extend above the first fragment and therefore above the doped region by at least a length of a maximum edge location error, as long as no edge location errors occur.

The invention avoids the disadvantages of the prior art described above. Since the contact holes are each offset only relative to the same side of the doped regions, it is possible to provide many adjacent doped regions with contacts, and the spacing between all of the adjacent doped regions and the spacing between all of the adjacent contacts can both be minimized. With the invention it is possible to attain semiconductor arrays that have very regular structures. In particular, the spacings between the doped regions and the spacings between the contact holes can be of equal size. If the doped regions and the contact holes have the same dimensions, then the spacing between the doped regions can also match the spacing between the contact holes.

Advantageously, semiconductor arrays can also be produced according to the invention which have conducting regions between the doped regions on the surface of the substrate, with the conducting regions being surrounded by the insulated regions. A conducting region of that kind may, for instance, be the gate of a transistor. The doped regions adjacent the conducting region or the insulated region surrounding it on both sides then form the drain and the source of the transistor.

The invention is especially advantageous for achieving semiconductor arrays that typically have great regularity of layout and in which many closely spaced doped regions are to be contacted. These include, for instance, memory arrays and in particular dynamic memories (DRAMs). Single-transistor DRM memory cells are known to have a selection transistor and a memory cell capacitor. If the DRAM memory cells are constructed by the stacked capacitor technique, then the memory cell capacitor is disposed above the transistor.

According to the invention, it is now advantageously possible to produce both the bit line contact between a bit line and one of the channel terminals (drain or source) of the transistor and the so-called "inner contact" between the other channel terminal of the transistor and the memory cell capacitor disposed above the transistor by the same process, through the use of self-adjusted contacts. In self-adjusted contacts, the contact surface is not defined lithographically (that is, by photographic techniques) but rather by already existing structures.

The invention makes it possible in particular to produce semiconductor arrays with a so-called "minimum pitch" or increment. The minimum pitch is twice the so-called "minimum design rule". The minimum design rule is equivalent to the minimum length of a structure to be produced and the minimum spacing of two structures that can be made with the particular technology employed. In semiconductor arrays made with a minimum pitch, the dimensions of the doped regions, the insulated regions and the contact holes and the corresponding respective spacings essentially meet the minimum design rule. Deviations therefrom can be ascribed to production variations or to technology-dependent factors known to one skilled in the art.

In order to produce the semiconductor array with a minimum pitch, it is especially favorable if the contact surfaces extend above the insulated region over a length of twice the allowable so-called "maximal edge location error" between two structures in the technology employed, beginning on the side of each insulated region oriented toward the respective doped region. The edge location error is the mutual offset of the edges of two structures to be produced and is composed of dimensional error and adjustment error. By a rough rule of thumb, the maximum edge location error amounts to one-third the above-defined minimum design rule.

If the contact surfaces have the form just described, then a semiconductor array with minimum pitch can be achieved, since misadjustments of up to the order of magnitude of the maximum edge location error are easily possible in the production of the contact holes (which, as described, have a length on the order of magnitude of the minimum design rule a in the first lateral direction), without causing undesired short circuits between the structures to be made. The short circuits are avoided because it is assured in every case that the etching of the contact holes takes place only above the corresponding contact surfaces that act as an etching stop. In this structure, the contact surfaces have a length in the first lateral direction that is equal to the length of the contact holes (equals minimum design rule), plus twice the maximum edge location error. A central disposition of the edge location errors above the contact surfaces thus produces a spacing from the edge of the contact surfaces of the length of the maximum edge location error in each case, both to the left and the right in the first lateral direction.

The contact surfaces may be produced from two fragments. The first fragment is that part of the contact surface which extends above the doped region, and the second fragment is that part of the contact surface which extends above the insulated region. If the second fragment is produced in such a way that, as long as no edge location error occurs, it extends above the first fragment and therefore above the doped region over at least the length of the maximum edge location error, then it is assured that a cohesive contact surface will result even in the event that edge location errors occur.

With a method (which will be described below) that is known from the aforementioned U.S. Pat. No. 4,729,969, for instance, the first fragment is formed only above the doped region, without edge location errors occurring relative thereto. In other words, it is possible for edge location errors to occur only in the production of the second fragment. However, since that fragment according to the invention overlaps the first fragment by the length of the maximum edge location error and is equally far away from the next contact surface, it is assured that even if the contact surfaces are produced with minimum pitch, short circuits will not occur between them.

That kind of attainment of a plurality of self-adjusted contacts with minimum pitch has not been possible until now, neither in the prior art described nor in any other prior art. If in fact the contact surfaces are disposed, as usual, centrally above the doped regions, then logically, as long as no edge location errors occur, they extend above the insulated regions on both sides of each of the contact holes by the length of the maximum edge location error, so that once again the contact surfaces have a length of ⅝ of the minimum design rule, and the contact holes can be placed on them without problems. If that structure were made with minimum pitch, the result, if no edge location errors occur, as in the subject of the invention, would be a spacing between the contact surfaces on the order of magnitude of the maximum edge location error. If then in the production of the semiconductor array two of the contact surfaces each became misadjusted in such a way that for each of them an edge location error in the direction of the other contact surface occurred, those edge location errors would add up, so that an overlap of the two contact surfaces could occur.

Conversely, if in the prior art, as usual, two adjacent contact surfaces were made through the use of the same photolithographic process, then their mutual spacing would have to be equal to the minimum design rule. In other words, once again they could not be made with minimum pitch.

The fact that a structure with minimum pitch is not possible with the subject of U.S. Pat. No. 4,729,969 is already apparent from the assumption asserted there that the spacing between the contact surfaces differs from that between the doped regions, and that a regular configuration of both the contacts and the doped regions, as defined above, it is not possible.

Conversely, in the subject of the invention, a short circuit cannot occur between two of the contact surfaces, since only the second fragment of the contact surfaces above the insulated region located on the same side of each doped region is produced photolithographically, and thus only the second fragment can be affected by edge location errors, and if no edge location errors occur it has a spacing from the next adjacent contact surface on the order of magnitude of the maximum edge location error. The second fragments of two adjacent contact surfaces then even with minimum pitch have a mutual spacing on the order of magnitude of the minimum design rule.

Other features which are considered as characteristic for the invention are set forth in the appended claims.

Although the invention is illustrated and described herein as embodied in a semiconductor array with self-adjusted contacts and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
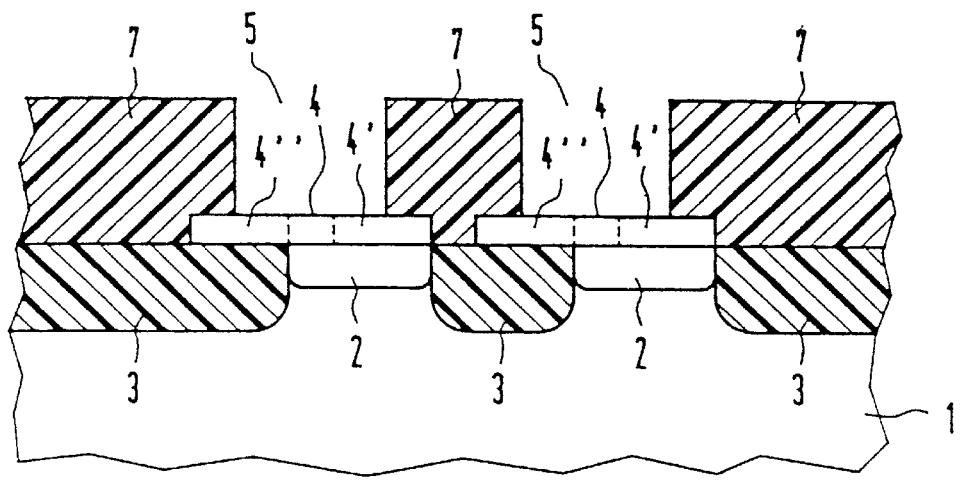
FIGS. 1 and 2 are fragmentary, diagrammatic, cross-sectional views

Referring now to the figures of the drawings in detail and first, particularly, to FIG. 1 thereof, there is seen a substrate 1 having a surface on which two doped regions 2 that are adjacent in a first lateral direction are disposed. To the left of each doped region 2 is an insulated region 3, which is constructed in the substrate as trench insulation. One of these two insulated regions 3 is thus located between the two doped regions 2. Electrodes or contact surfaces 4 connected to the doped regions 2 are located above the doped regions 2 on the substrate 1. The contact surfaces 4 extend not only above the respective doped region 2 but also partially above each insulated region 3 located to the left of the respective doped region. That part of each contact surface 4 which is located exclusively above the doped region 2 will be referred to below as a first fragment 4'. That part of each contact surface 4 which is located above the insulated region 3 will be referred to below as a second fragment 4". If both fragments 4', 4" are produced separately from one another, then the second fragment 4" must extend not only above the insulated region 3 but also partially above the respective doped region 2, so that it overlaps the first fragment 4'. As explained below, this is necessary if the semiconductor array is produced with minimum pitch.

In an insulating layer 7 covering the structures described thus far, there is one contact hole 5 above each contact surface 4, for receiving non-illustrated contacts which can be made in the form of contact hole fillings. The contact holes 5 are disposed centrally above the contact surfaces 4, or in other words offset from the doped regions 2. The assumption is that no edge location errors have occurred in the production of the contact holes 5.

Figure 2:
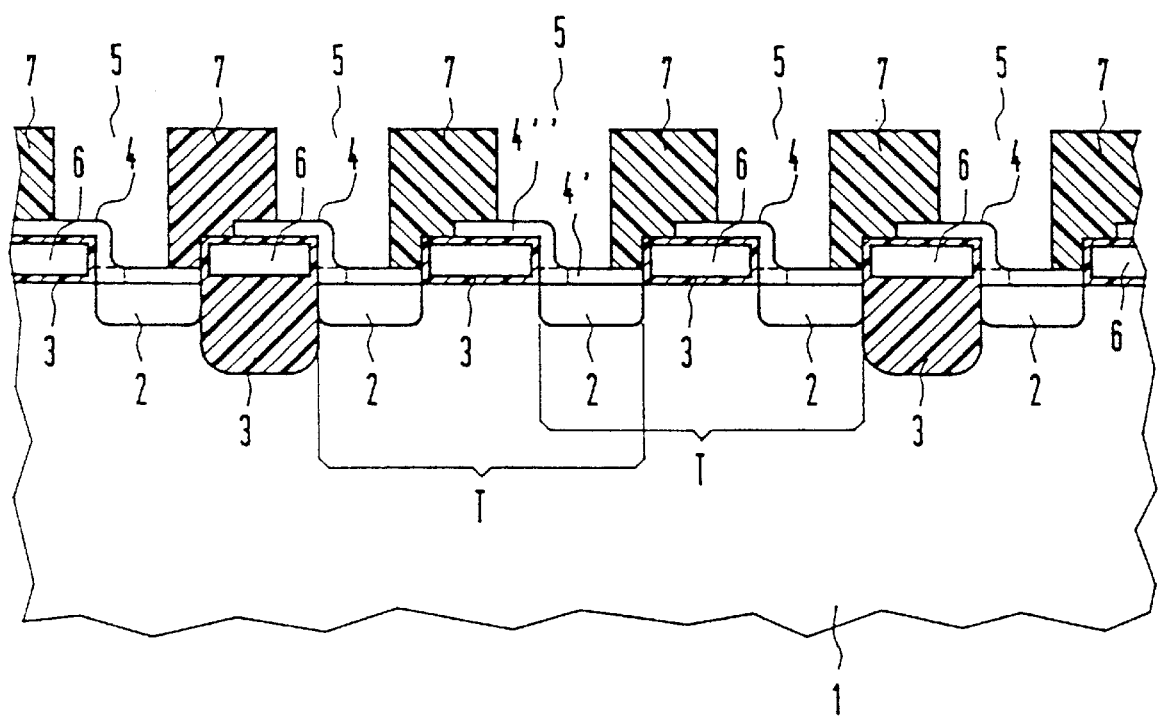
Figure 3:
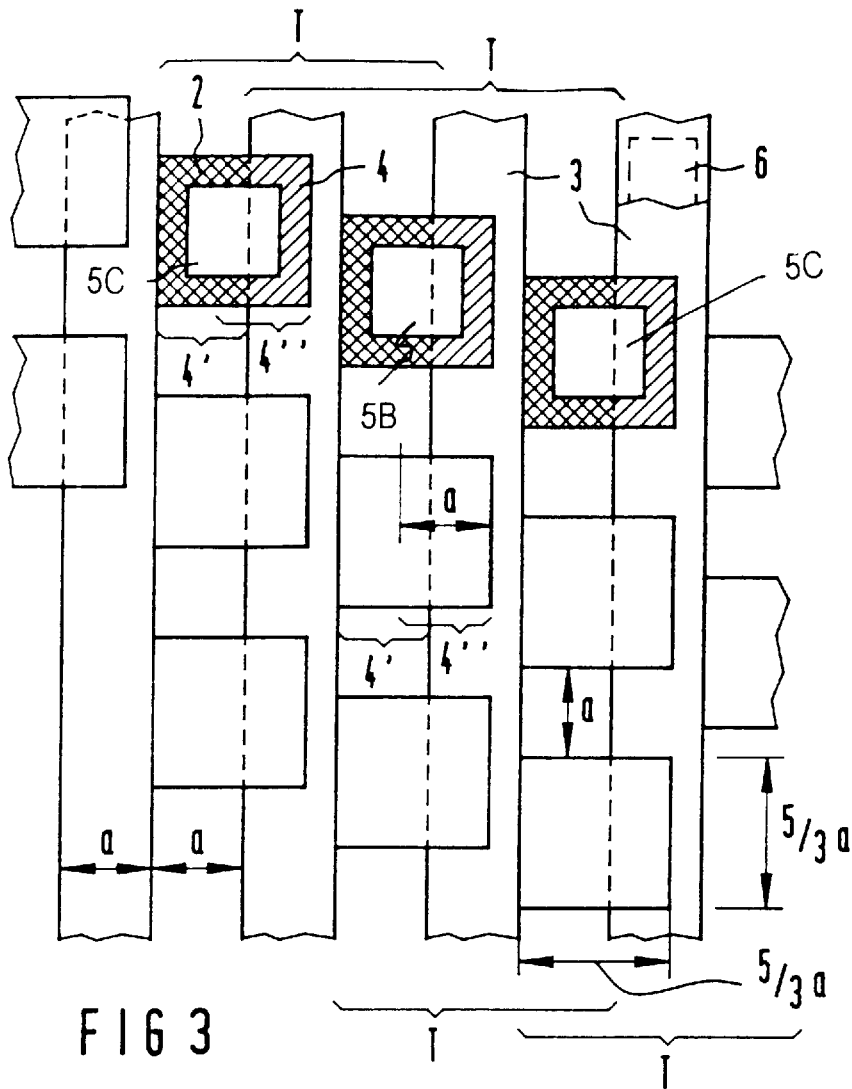
FIG. 3 is a fragmentary, diagrammatic, plan view of embodiments of the invention.

FIGS. 1–3 show semiconductor arrays in the production of which no edge location errors have occurred. This is an ideal case that rarely can be attained in practice. In practice, because of process inaccuracies, edge location errors will occur between the contact holes 5 and the contact surfaces 4 and between the contact surfaces 4 and the doped regions 2 or the insulated regions 3. In order to produce the contact surfaces 4, methods must be used which assure that they will extend in the first lateral direction over the entire length of the doped regions 2 (this is true for the first fragment 4'), while only on the same side do they also extend above the corresponding insulated region 3 (this is true for the second fragment 4").

The following description explains how the semiconductor array of FIG. 1 is produced. First, the doped regions 2 and the insulated regions 3 are made in the substrate 1. Next, the contact surfaces 4 are formed. The insulation layer 7 is then applied, whereupon etching of the contact holes 5 is performed. In a further step, in order to form the contacts, the contact holes 5 can then be filled with a material, for which metal in particular, such as aluminum, may be considered.

Methods for producing the described structures and the materials from which they can be produced are known to one skilled in the art and will therefore not be described in further detail herein. Only those structures which are essential to the description of the invention, and their production, will be shown and described herein.

The contact surfaces 4 may, for instance, be produced from polysilicon. A corresponding production method is described in Published European Patent Application 0 567 815 A1. Accordingly, a polysilicon layer is applied, which is doped, for instance with boron, in the region of the contact surfaces 4 to be formed. The undoped polysilicon is then selectively removed to the boron-doped polysilicon by suitable etching (such as wet etching, for instance with KOH). The doping of the polysilicon above the doped regions 2 (first fragment 4') is done automatically by diffusion of boron out of the doped regions 2, once the latter have been doped with boron. The first fragment 4' can accordingly be produced without the creation of edge location errors, since doping needs to be performed only in the region of the second fragment 4".

Another option for producing the contact surfaces 4 is to form a metal silicide. It is known that to form a metal silicide, a metal layer is first applied and then a structured polysilicon layer. Next, a tempering is performed, as a result of which the metal, such as titanium, and the polysilicon combine to form a silicide. It is also possible to apply a polysilicon layer first and then a structured metal layer. Both variants are described in U.S. Pat. No. 4,729,969. In both cases, polysilicon needs to be applied in structured form only where the contact surfaces 4 to be formed extend above the insulated regions 3 and moreover to some distance above the corresponding adjacent doped region 2 (second fragment 4"). In the case of a silicon substrate, a silicide is in fact automatically created above the doped regions 2 (first fragment 4') by salicidation (formation of a "salicide"="self-aligned silicide"), if tempering is carried out after a metal layer has been applied. In any case, it must be assured that the silicide formed by the salicidation (first fragment 4') and the silicide formed by application of this structured polysilicon layer (second fragment 4") will overlap. It is only then that a cohesive contact surface 4 formed.

The same is true for the contact surfaces 4 of doped polysilicon described above: there, an overlap of the doped portion of the polysilicon layer (second fragment 4") with the doped regions 2 must be assured. The width of the overlap zone must accordingly be equivalent to at least the maximum edge location error, so that misadjustments will not cause the two fragments 4', 4" to fail to overlap, ensuring that a common contact surface 4 can be formed.

It is important that in the anisotropic etching of the contact holes 5, etching be done only above the contact surfaces 4 that act as an etching stop, and not next to them. Otherwise, the insulated regions 3 or the substrate would be damaged by the etching, and short circuits could occur between the structures to be made. For this reason, the contact surfaces 4 must have larger dimensions than the contact holes 5, so that misadjustment of the contact surfaces 4 and the contact holes 5 relative to one another will not matter. The necessary length of the part of each contact surface 4 that is located above the corresponding insulated region 3 (that is, the second fragment 4") depends among other factors on the desired dimensions of the contact holes 5. These dimensions must be defined in such a way that an edge location error relative to the contact surfaces 4 occurring in the production of the contact holes 5 will be harmless.

The structure shown in FIG. 1 and in FIG. 2 that has yet to be described herein may have the same dimensions in the first lateral direction. This is the case, for instance, if they are made with minimum pitch: in the first lateral direction, the dimensions of the doped regions 2, insulated regions 3 (or conducting regions 6 in the case of FIG. 2), contact holes 5 and bars in the insulating layer 7 between the contact holes 5 are then substantially equivalent to a "minimum design rule a" of the technology by which the semiconductor array production is carried out. In this case, it is advantageous if the contact surfaces 4 extend above the insulated regions 3 over a length of twice the maximum edge location error. In that case, they have a total width of ⅝ the minimum design rule a: that is ⅗ above the doped region 2 and ½ a above the adjacent insulated region 3.

As a consequence, an allowable edge location error results in the production of the contact holes 5 relative to the contact surfaces 4, on the order of magnitude of the maximum edge location error, to the left and right in the first lateral direction. Since the spacing between the contact surfaces 4 is everywhere equal to at least the maximum edge location error, their adjustment is likewise uncritical. It can be concluded that unproblematic attainment of the semiconductor array with minimum pitch is possible, even if arbitrarily many doped regions 2 that are to be contacted are disposed side by side as described.

FIG. 2 shows a similar semiconductor array to FIG. 1. However, this time a plurality of doped regions 2, that are adjacent to and spaced apart from one another in the first lateral direction, are shown along with the corresponding insulated regions 3, contact surfaces 4 and contact holes 5. In contrast to FIG. 1, the insulated regions 3 are located above the substrate 1. Only two of the insulated regions 3 which are shown extend into the substrate 1 as well, in the form of a trench insulation. Above the substrate 1, the insulated regions 3 each surround one conducting region 6 that is insulated from the substrate 1. The two middle conducting regions 6 may, for instance, be the gates of two transistors T. The middle one of the doped regions 2 represents a common channel terminal (drain or source) of these transistors T. In that case, the insulation of the conducting regions 6 from the substrate 1 corresponds to a gate oxide. Both the common channel terminal of the two transistors T and the further channel terminals of the transistors 2, formed by the two outer doped regions 2, can be contacted through the corresponding contact holes 5. The insulated regions 3 which are adjacent these two transistors T and which also extend into the substrate 1, are field oxide regions.

This kind of configuration of transistors T occurs, for instance, in DRAMs having memory cells which are constructed according to the stacked capacitor technique, and in which the transistors have one common bit line contact for every two memory cells. If FIG. 2 is thought of as an illustration of this kind of configuration, then the middle doped region 2 can be connected to a bit line through a bit line contact that is formed by filling up the corresponding contact hole 5*b*. The two outer doped regions 2 can each be connected to one stacked capacitor through the respective contact hole 5*c* and so-called "inner contacts".

The invention now makes it possible, as already explained, for the entire array to be produced with minimum pitch. This means that the dimensions of the conducting regions 6, the doped regions 2 and the contact holes 5, and of the segments of the insulating layer 7 that are located between the latter, are essentially equivalent in the first lateral direction (taking production variations into account) to the minimum design rule a, which is dependent only on the technology employed.

This is attained by providing that the contact surfaces 4 have a length of ⅝ the minimum design rule a. Adjusting the contact holes 5 to the contact surfaces 4 can then be carried out with the imprecision of the maximum edge location error, which is ⅓ the minimum design rule a, without damaging the insulated regions 3 or the substrate 1, the consequence of which would be a possible short circuit. In other words, if no edge location errors occur, the contact holes 5 are offset in the first lateral direction by ⅓ the minimum design rule a from the doped regions 2.

FIG. 3 shows the embodiment which was already discussed above, of the memory cells of a DRAM according to the stacked capacitor technique. The illustration is purely diagrammatic and is shown in more detail only with respect to the transistors T of two memory cells with a common bit line contact, corresponding to the description of FIG. 2. The doped regions 2 that form these transistors T are offset from one another in a second lateral direction. In this exemplary embodiment, the second lateral direction extends at right angles to the first lateral direction. For the sake of clarity, the dimensions of the structures shown have been included in FIG. 3, as referred to the minimum design rule a. This rule, as already noted, is equal to half the minimum pitch of the technology employed to produce the semiconductor array.

FIG. 3 diagrammatically shows that the memory cells are regularly disposed. Two selection transistors with a common bit line contact, which are adjacent the selection transistors T shown in emphasized fashion in FIG. 3, by way of example are disposed as follows: the emphasized transistors T are shifted by the minimum pitch, that is by 2a, first downward and then an equal distance to the left. In this way, a memory matrix with mutually offset memory cells is obtained.

The plan view shows four parallel-disposed, elongated insulated regions 3. One of the conducting regions 6 surrounded by them is suggested in dashed lines in FIG. 3 in the upper portion of the right-hand insulated region 3. In this exemplary embodiment, the conducting regions 6 form word lines of the DRAMs and at the same time are the gates of the memory cell transistors T.

The memory cell transistors T are disposed in a so-called "quarter pitch layout". This means that the doped regions 2 forming them are offset from one another in the second lateral direction. In the exemplary embodiment of FIG. 3, this offset (which is ⅔ a) has advantageously been selected in such a way that an optimized configuration of the transistors T results. It is then possible in fact to attain the error-results tolerant spacings, described below, between the structures that are to be produced. In particular, through the use of this quarter pitch layout, the adjustment of the contact holes 5 in the direction of the course of the word lines is not critical. A problem-free adjustment of the contact holes 5 at right angles thereto is attained through the use of the asymmetrical or eccentric embodiment according to the invention of the contact surfaces 4 relative to the doped regions 2.

One of the doped regions 2, which is rectangular, is located between each two word lines. Conversely, the contact surfaces 4 are square and extend not only above these doped regions 2 but also to some distance above the respective insulated regions 3 adjacent them on the right.

The width of the insulated regions 3 and of the conducting regions 6 and their spacings from one another are equal to the minimum design rule a. The dimensions of the doped regions 2 in the direction of the course of the word liens are equal to ⅝ the minimum design rule a, and in the direction at right angles thereto are equal to the minimum design rule a. The contact surfaces 4 are square, with a length on a side of ⅝ the minimum design rule a. In other words, they extend above the corresponding doped regions 2 for ⅗ of the minimum design rule a and above the respective insulated region 3 for ⅔ of the minimum design rule a. Their mutual spacing in the direction of the course of the word lines (of the insulated regions 3 and the conducting regions 6, respectively) is equal to the minimum design rule a, and at right angles thereto is equal to the maximum edge location error of ⅓ the minimum design rule a.

The contact holes 5 are also square, and their edge length is equal to the minimum design rule a. Since with precise adjustment of the contact holes 5 to the contact surfaces 4, a safety margin of spacing in each direction exists on the order of magnitude of the maximum edge location error, and the contact surfaces 4 have at least a spacing from one another of the same magnitude, the production of an error-free semiconductor array with minimum pitch is assured, even if the maximum edge location error occurs.

If the contact surfaces 4 are, for instance, made of a metal silicide by first applying a metal layer, then it suffices to apply polysilicon only to the insulated regions 3 and to the edge of the doped regions 2 (second fragment 4" of the contact surfaces 4), since in the tempering, silicide is automatically formed by salicidation above the doped region (first fragment 4').

Assurance must merely be provided that the "salicide" and the silicide, which is formed above the insulated regions 3, overlap. To that end, the polysilicon must accordingly be applied, as measured from the respective insulated region 3, for at least the maximum edge location error, including above the doped region 2. The same is true for the production of the contact surfaces 4 of boron-doped polysilicon.

Figure 4:
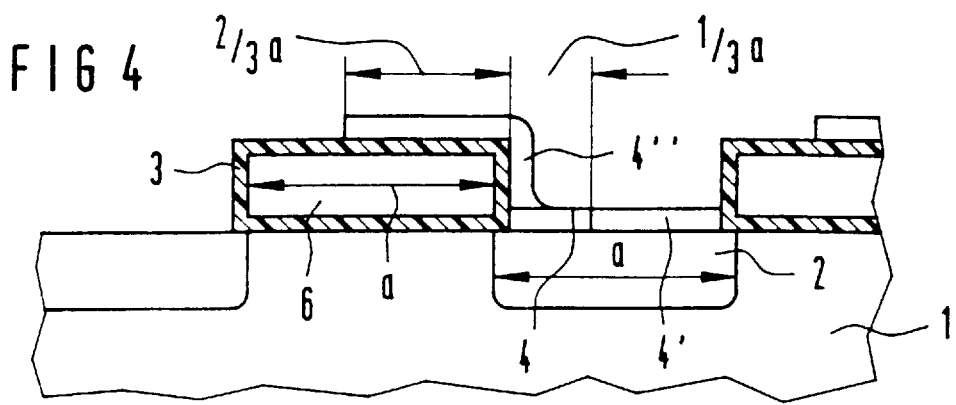
FIG. 4 is a fragmentary, cross-sectional view of a portion of the exemplary embodiments of FIGS. 2 and 3, when they are made with minimum pitch.

FIG. 4 is a detail view of the exemplary embodiments of FIGS. 2 and 3, in a cross-sectional illustration for the case where they are made with minimum pitch and thus no edge location error has occurred. Essentially what is shown is one of the doped regions 2 and the corresponding insulated region 3. Both of them (like the contact holes 5 which are not shown in FIG. 4), with minimum pitch, have the length of the minimum design rule a in the first lateral direction. The contact surface 4 has the first fragment 4' and the second fragment 4". The first fragment 4' extends solely above the doped region 2, in a length of approximately the minimum design rule a. The second fragment 4" likewise has the length a and extends in a length of ⅔ a above the insulated region 3 and in a length of ⅓ a above the doped region 2, so that in this case an overlap by ⅓ a comes about between the first fragment 4' and the second fragment 4".

It should be noted that deviations from production variations in the described dimensions and spacings should be expected. In particular, it is possible that some of the insulated regions 3 may also extend above the doped regions 2. This can occur from lateral diffusion of the dopant atoms in the doped regions 2, or if the conducting regions 6 are provided it can occur from their lateral insulation ("spacers"), which are a component of the insulated regions 3.

It is understood that the invention is also suitable for the production of memory cells that each have a separate bit line contact.

Technological peripheral conditions may require constructing the structures without the minimum pitch, unlike FIG. 3. For example, in a DRAM a somewhat longer transistor is usual, in order to increase the resistance to blocking and thus the data holding time. However, since the configuration according to the invention even enables a construction with minimum pitch, no more-extensive restrictions in construction are involved aside from the technological peripheral conditions mentioned. Technological improvements can accordingly be utilized to the full extent. For instance, if it is successfully possible to assure the blocking resistance of the transistors even with transistor lengths on the order of magnitude of the minimum design rule a, then the memory cell can be made smaller by the resultant portion of the area. In the case of a semiconductor array which is not constructed with minimum pitch, on the other hand, but produced according to the invention, larger safety margins of spacing, for instance, between the structures can be provided, and the safety of the process can thus be increased.

I claim:

1. A semiconductor array, comprising;

a substrate having a surface;

two adjacent, spaced-apart doped regions having edges extending in a first lateral direction disposed on said surface;

insulated regions each associated with a respective one of said doped regions and extending in said first lateral direction on a given side;

contact surfaces directly and completely covering each of said doped regions and extending in said first lateral direction and being at least partially disposed over said insulated regions;

each of said contact surfaces having an edge on a side facing away from each of said respective insulated regions which are congruently self-aligned with respect to said edges of said doped regions;

an insulating layer having contact holes formed therein above each of said contact surfaces for receiving a contact;

said contact holes being disposed such that they are centered within production tolerances on said contact surfaces; and a first distance between said doped regions in said first lateral direction and a second distance between said contact holes in said first lateral direction being substantially equal within production tolerances, said doped regions, said insulated regions and said contact holes dimensioned to substantially meet a given minimum design rule dimension of an employed technology by which a semiconductor array is produced.

2. The semiconductor array according to claim 1, wherein each of said contact surfaces in said first lateral direction are dimensioned to be within production tolerances according to the minimum design rule dimension a plus twice a maximum edge position error, and shown by the formula (a+2a/3).

3. The semiconductor array according to claim 1, including a conducting region insulated by said substrate and surrounded by one of said insulated regions.

4. The semiconductor array according to claim 3, wherein said conducting region is a gate of a transistor and said doped regions adjacent to said conducting region are a drain and a source of said transistor.

5. The semiconductor array according to claim 4, wherein said contact holes are bit line contact holes for receiving bit line contacts and capacitor contact holes for receiving capacitor contacts of said transistor;

said contact surfaces in said first lateral direction have a distance between them of a/3;

said contact holes in said first lateral direction have a distance between them of a;

said contact surfaces in a second lateral direction which is perpendicular to said first lateral direction have a distance between them of a; and said contact holes in said second lateral direction have a distance between them of 5/3a.

6. The semiconductor array according to claim 1, wherein one of said doped regions is disposed, offset, in a second lateral direction with respect to a doped region adjacent to it in said first lateral direction.

7. The semiconductor array according to claim 6, wherein said offset is substantially twice a maximum edge position error.

8. The semiconductor array according to claim 1, wherein said contact surfaces are formed of metal silicide.

9. The semiconductor array according to claim 1, wherein said contact surfaces are formed of polysilicon.

* * * * *